(12) United States Patent
Kang et al.

(10) Patent No.: US 8,953,138 B2
(45) Date of Patent: Feb. 10, 2015

(54) FLAT PANEL DISPLAY AND METHOD OF FABRICATING THE SAME

(75) Inventors: Tae-Min Kang, Suwon-si (KR); Jae-Ho Lee, Suwon-si (KR); Seong-Taek Lee, Suwon-si (KR); Jin-Soo Kim, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1136 days.

(21) Appl. No.: 11/398,606

(22) Filed: Apr. 6, 2006

(65) Prior Publication Data

US 2006/0227281 A1 Oct. 12, 2006

(30) Foreign Application Priority Data

Apr. 7, 2005 (KR) .................. 10-2005-0029189

(51) Int. Cl.
*G02F 1/1333* (2006.01)
*H01L 51/00* (2006.01)
*H01L 27/32* (2006.01)
*H01L 51/56* (2006.01)

(52) U.S. Cl.
CPC ......... *H01L 51/0013* (2013.01); *H01L 27/3244* (2013.01); *H01L 51/56* (2013.01)
USPC ............................ 349/160; 349/158; 349/159

(58) Field of Classification Search
USPC .................................. 349/158–160, 123–136
See application file for complete search history.

(56) References Cited

U.S. PATENT DOCUMENTS

| 3,957,364 A | 5/1976 | Markle et al. |
| 4,549,084 A | 10/1985 | Markle |
| 4,676,630 A | 6/1987 | Matsushita et al. |
| 4,677,301 A | 6/1987 | Tanimoto et al. |
| 4,747,678 A | 5/1988 | Shafer et al. |
| 4,908,656 A | 3/1990 | Suwa et al. |
| 4,924,257 A | 5/1990 | Jain |
| 5,184,176 A | 2/1993 | Unno et al. |
| 5,194,893 A | 3/1993 | Nishi |
| 5,359,434 A | 10/1994 | Nakao et al. |
| 5,440,397 A | 8/1995 | Ono et al. |
| 5,506,684 A | 4/1996 | Ota et al. |

(Continued)

FOREIGN PATENT DOCUMENTS

| CN | 1436025 | 8/2003 |
| CN | 1453636 | 11/2003 |

(Continued)

OTHER PUBLICATIONS

European Search Report corresponding to European Patent Application No. EP06112234.7-2203, issued on Apr. 10, 2007.

(Continued)

*Primary Examiner* — Charles Chang
(74) *Attorney, Agent, or Firm* — Robert E. Bushnell, Esq.

(57) ABSTRACT

In a flat panel display and a method of fabricating the same, the flat panel display includes a substrate having a pixel region and alignment mark regions. The alignment mark regions are disposed at opposite sides of the pixel region and along the pixel region. A unit pixel array is arranged on the pixel region in a matrix manner. The alignment mark regions have at least one pair of alignment marks disposed thereon in an opposing manner. The alignment mark pairs are located in correspondence with respective columns of the unit pixel array.

8 Claims, 12 Drawing Sheets

(56) References Cited

U.S. PATENT DOCUMENTS

| | | |
|---|---|---|
| 5,581,324 A | 12/1996 | Miyai et al. |
| 5,643,801 A | 7/1997 | Ishihara et al. |
| 5,754,300 A | 5/1998 | Magome et al. |
| 5,910,830 A * | 6/1999 | Nam .......................... 349/158 |
| 5,970,310 A | 10/1999 | Satoh et al. |
| 6,057,867 A | 5/2000 | Chan et al. |
| 6,251,550 B1 | 6/2001 | Ishikawa |
| 6,582,875 B1 | 6/2003 | Kay |
| 6,610,961 B1 | 8/2003 | Cheng |
| 2003/0067569 A1 * | 4/2003 | Chang et al. .................. 349/106 |
| 2003/0076572 A1 | 4/2003 | Kawase |
| 2003/0201440 A1 | 10/2003 | Satou et al. |
| 2005/0020175 A1 * | 1/2005 | Tamashiro et al. ............. 445/24 |
| 2005/0041002 A1 * | 2/2005 | Takahara et al. ................ 345/76 |
| 2005/0129850 A1 * | 6/2005 | Jung et al. ..................... 427/258 |
| 2005/0236620 A1 * | 10/2005 | Yamada .......................... 257/59 |

FOREIGN PATENT DOCUMENTS

| | | |
|---|---|---|
| CN | 1476594 | 2/2004 |
| CN | 1513214 | 7/2004 |
| EP | 1357590 | 10/2003 |
| GB | 2379412 | 3/2003 |
| GB | 2396950 A | 7/2004 |
| JP | 11-002711 | 1/1999 |
| JP | 2002-072507 | 3/2002 |
| JP | 20022217535 | 8/2002 |
| JP | 2002344028 | 11/2002 |
| JP | 2003318372 | 11/2003 |
| JP | 2004095555 | 3/2004 |
| JP | 2004-337726 | 12/2004 |
| JP | 2005-017333 | 1/2005 |
| JP | 2005-502987 | 1/2005 |
| WO | 2004-050290 | 6/2004 |

OTHER PUBLICATIONS

Office Action from the Chinese Patent Office issued in Applicant's corresponding Chinese Patent Application No. 200610073278.7 dated Feb. 15, 2008.

Korean Office Action for Korean Patent Application No. 2005-29189, issued on Oct. 26, 2006.

European Office Action issued on May 31, 2013 by European Patent Office in the examination of the European Patent Application No. 06112234.7-1552, which corresponds to Korean Patent Application serial No. KR2005-0029189, that cited and interpreted GB2396950.

\* cited by examiner

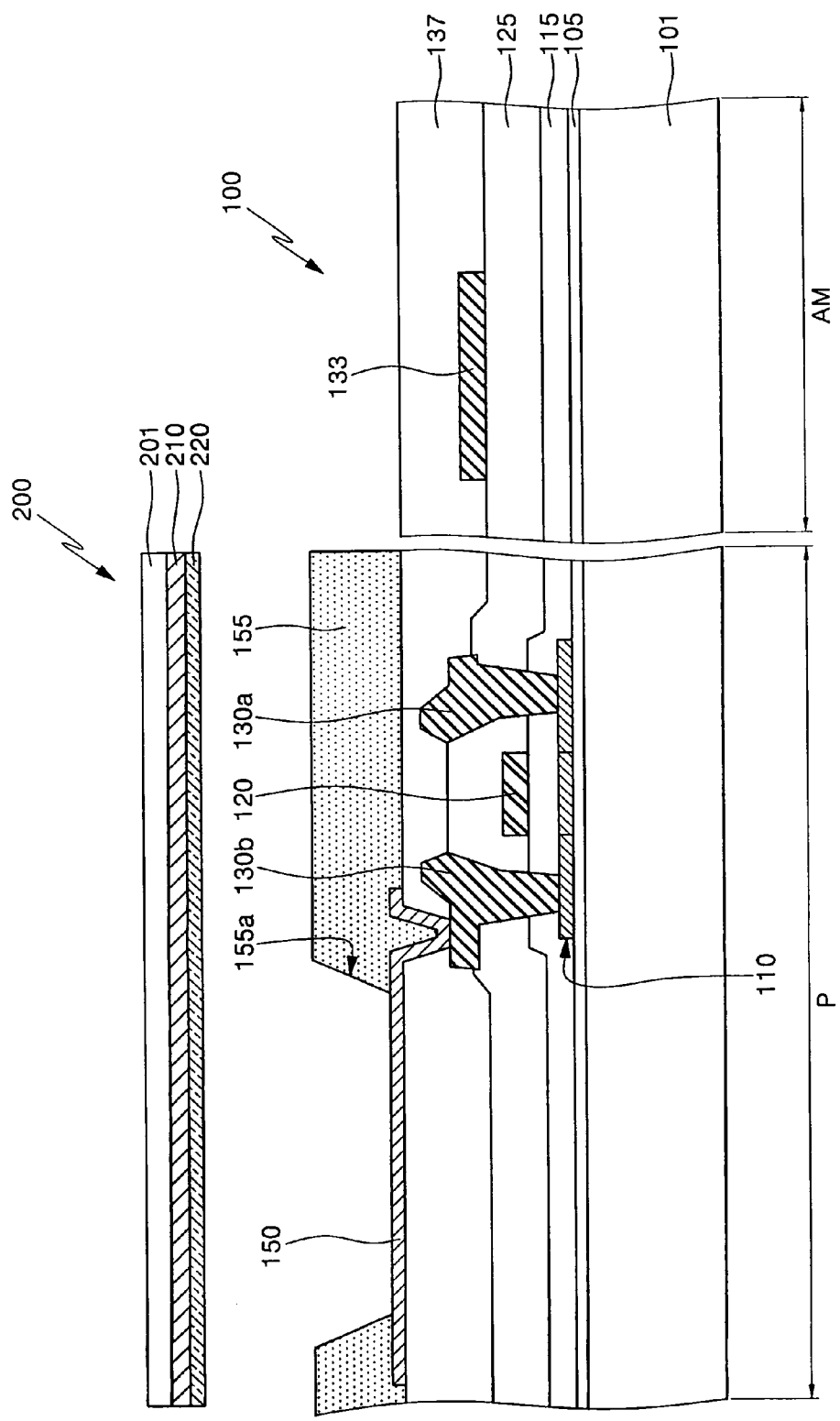

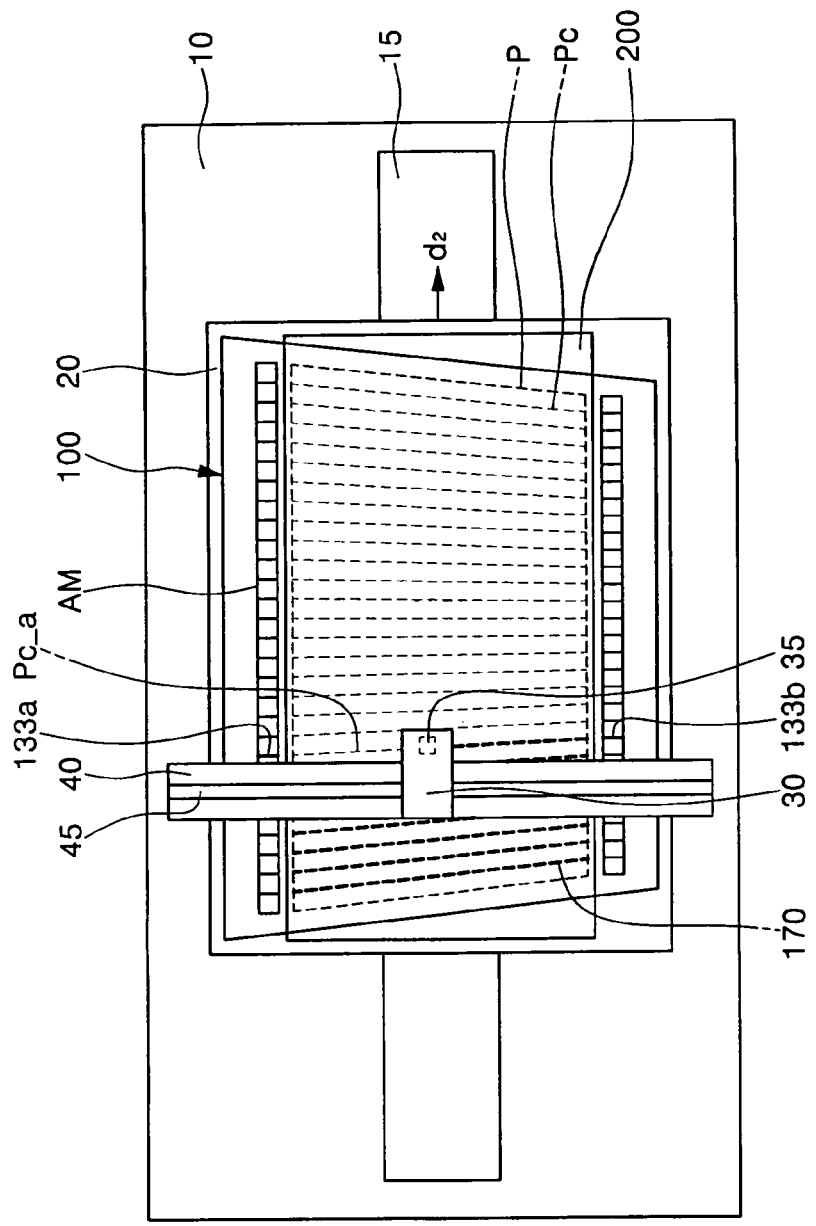

FLAT PANEL DISPLAY AND METHOD OF FABRICATING THE SAME

CLAIM OF PRIORITY

This application makes reference to, incorporates the same herein, and claims all benefits accruing under 35 U.S.C. §119 from an application for FLAT PANEL DISPLAY AND FABRICATION METHOD OF THE SAME earlier filed in the Korean Intellectual Property Office on the 7th of April 2005 and there, duly assigned Ser. No. 10-2005-0029189.

BACKGROUND OF THE INVENTION

1. Technical Field

The present invention relates to a flat panel display and a method of fabricating the same and, more particularly, to a flat panel display including alignment mark regions and a method of fabricating the same.

2. Related Art

Recently, the flat panel display has attracted public attention as a display device capable of substituting for a cathode ray tube display due to its light weight and slim characteristics. The flat panel display includes a liquid crystal display (LCD), an organic light emitting display (OLED), a plasma display panel (PDP), and a field emission display (FED).

These flat panel displays generally employ a glass substrate which is easily deformable at a high temperature, which may degrade precision of pattern formation in subsequent processes. Moreover, the larger the size of the device substrate, the larger the deformation, and therefore, it is more difficult to form a precise pattern.

Meanwhile, as one of the methods of forming a pattern on the flat panel display, the laser induced thermal imaging method may be employed. The laser induced thermal imaging method requires at least a laser, an acceptor substrate, and a donor film. The donor film includes a base film, a light-to-heat conversion layer, and a transfer layer. During the laser induced thermal imaging process, the transfer layer faces the acceptor substrate so that the donor film is laminated on the acceptor substrate, and then a laser beam is irradiated onto the base film. The beam irradiated onto the base film is absorbed into a light-to-heat conversion layer so as to be converted to heat energy, thereby transferring the transfer layer onto the acceptor substrate. As a result, a transfer layer pattern is formed on the acceptor substrate.

However, when the acceptor substrate is deformed as described above, it may be possible for formation errors of the transfer layer pattern to be generated when the laser beam is irradiated onto an inaccurate position.

SUMMARY OF THE INVENTION

The present invention provides a method of fabricating a flat panel display which is capable of forming a transfer layer pattern on a desired position of a substrate by irradiating a laser beam onto a precise position on the substrate, even when the substrate is deformed.

The present invention also provides a flat panel display capable of forming a transfer layer pattern on a desired position of a substrate, even when the substrate is deformed.

In an exemplary embodiment of the present invention, the flat panel display includes a substrate having a pixel region and alignment mark regions. The alignment mark regions are disposed at opposite sides of the pixel region and along the pixel region. A unit pixel array is arranged on the pixel region in a matrix manner. The alignment mark regions have at least one pair of alignment marks disposed thereon in an opposite manner. The alignment mark pairs are located in correspondence with a column of the unit pixel array.

In another exemplary embodiment of the present invention, the method of fabricating a flat panel display comprises disposing a device substrate on a chuck, the device substrate including a pixel region, alignment mark regions disposed at opposite sides of the pixel region and along the pixel region, a unit pixel array arranged on the pixel region in a matrix manner, and at least one pair of alignment marks disposed on the alignment mark regions in an opposite manner. The pair of alignment marks are located in correspondence with a column of the unit pixel array. Positions of the alignment mark pairs are measured using a camera. A position of the column of the unit pixel array corresponding to measured alignment mark pairs is calculated on the basis of the measured positions of the alignment mark pairs. A laser beam is irradiated along the calculated position.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 2B is a cross-section view taken along sectional lines I-I' and II-II' of FIGS. 1 and 2A, respectively;

FIGS. 4A thru 4D are plan views illustrating a method of fabricating a flat panel display in accordance with an embodiment of the present invention;

DETAILED DESCRIPTION OF THE INVENTION

Figure 1:
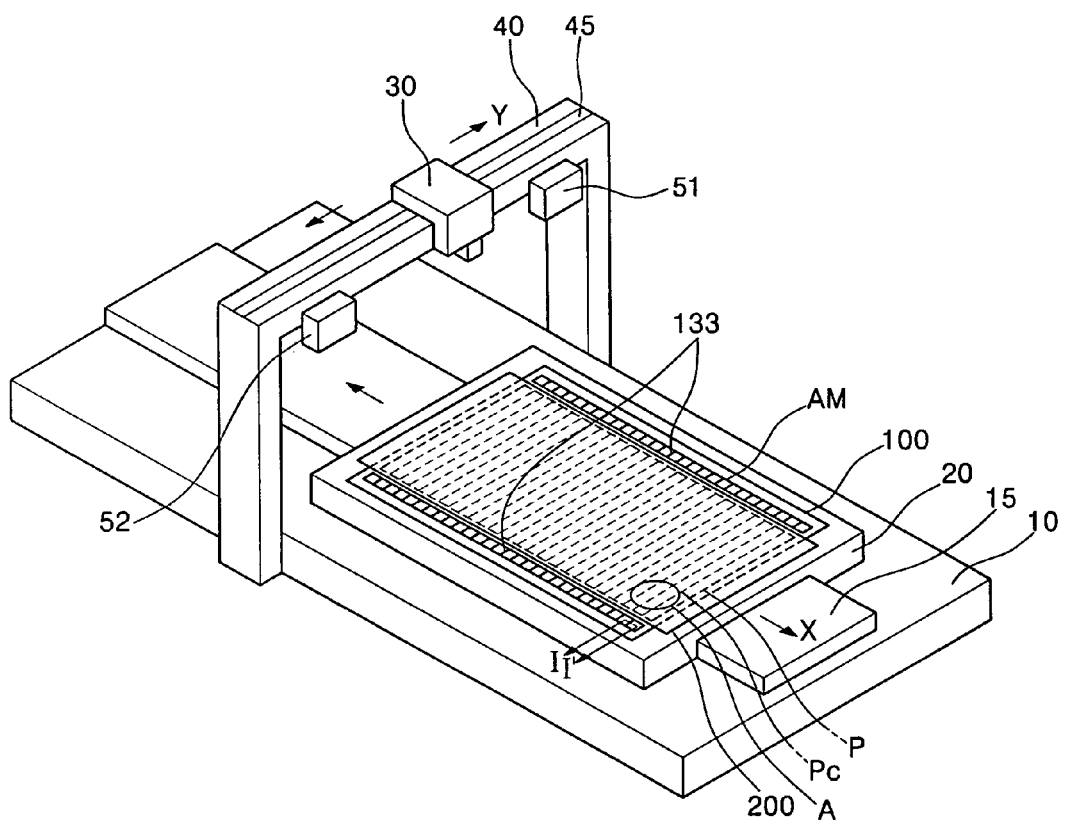
FIG. 1 is a schematic perspective view of a device substrate of a flat panel display and a laser induced thermal imaging apparatus for forming a pattern on the device substrate in accordance with an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the detailed description with reference to the drawings, when it is described that a layer is disposed "on" another layer or substrate, it means that the layer may be directly formed on another layer or substrate, or another layer may be interposed between the layers. Like reference numerals designate like elements throughout the specification.

FIG. 1 is a schematic perspective view of a device substrate of a flat panel display and a laser induced thermal imaging apparatus for forming a pattern on the device substrate in accordance with an embodiment of the present invention.

Referring to FIG. 1, the laser induced thermal imaging apparatus includes a substrate stage 10. A chuck 20 is disposed on the substrate stage 10. The substrate stage 10 includes a chuck guide bar 15 for moving the chuck 20 in an x-axis direction. Therefore, the chuck 20 is movable along the chuck guide bar 15 in the x-axis direction. The chuck 20 fixes a device substrate 100 on the chuck 20.

The device substrate 100 includes a pixel region P and alignment mark regions AM. The alignment mark regions AM are located at opposite sides of the pixel region P and along the pixel region P. The pixel region P includes a unit pixel array having columns Pc and rows.

The alignment mark regions AM include at least one pair of alignment marks 133 disposed opposite to each other. The alignment mark pairs 133 are located in correspondence with the column Pc of the unit pixel array. Furthermore, a plurality of alignment mark pairs 133 are located on the columns of the unit pixel array, respectively. Preferably, each of the alignment mark pairs 133 is located on a line extending from each column Pc of the unit pixel array.

A donor substrate 200 may be disposed on the device substrate 100 so as to cover at least the pixel region P.

An optical stage 40 is located on the chuck 20 so as to cross over the chuck 20. A laser irradiation apparatus 30 is installed on the optical stage 40. The optical stage 40 includes a laser guide bar 45 for guiding movement of the laser irradiation apparatus 30 in a Y-axis direction. The laser irradiation apparatus 30 may include a laser source (not shown), a beam shaping element (not shown), a mask (not shown), and a projection lens (not shown). The laser source is a device for generating a laser beam. The beam generated by the laser source passes through the beam shaping element. The beam shaping element converts a beam having a Gaussian profile generated by the laser source into a beam having a homogeneous flat-top profile. The homogeneous beam can pass through the mask. The mask includes at least one light transmission pattern or at least one light reflection pattern. The beam passing through the mask has an image patterned by the patterns. The laser beam having the patterned image passes through the projection lens so as to be irradiated onto the substrate, specifically, the donor substrate 200.

Cameras 51 and 52 are installed on respective side portions of the optical stage 40. The cameras 51 and 52 may be located at arbitrary positions, regardless of the number of cameras, so as to photograph the alignment mark pairs arranged in the alignment mark regions AM. The cameras 51 and 52 may be charge-coupled device (CCD) cameras.

Figure 2A:
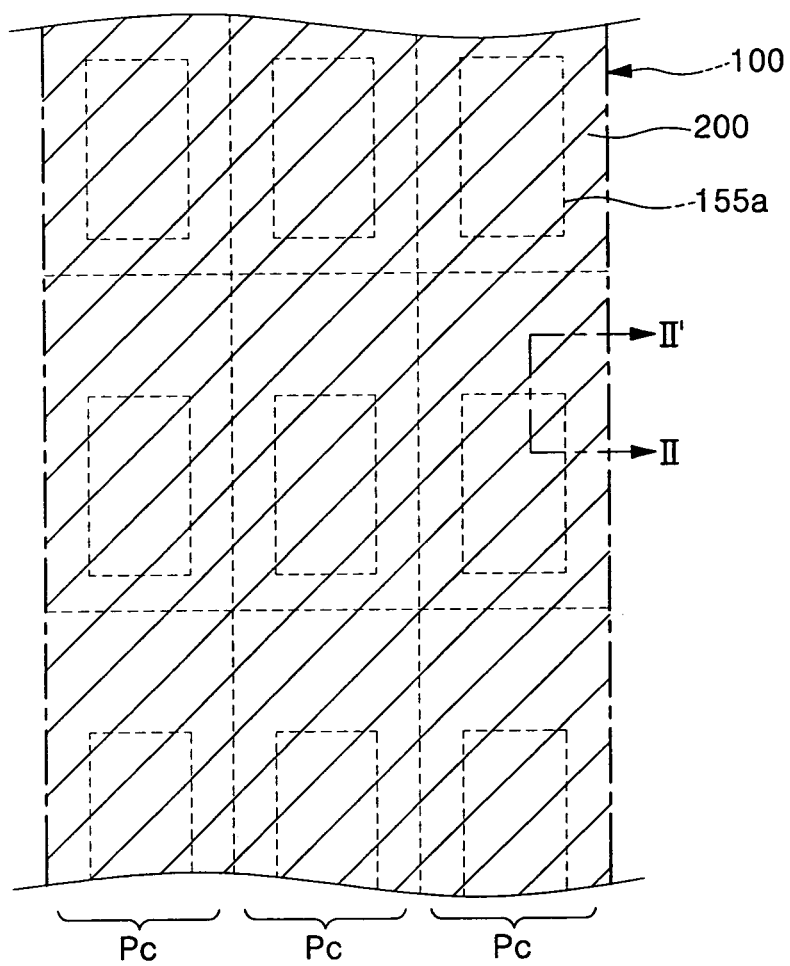
FIG. 2A is an enlarged plan view of region A of FIG. 1.

FIG. 2A is an enlarged plan view of region A of FIG. 1, and FIG. 2B is a cross-section view taken along sectional lines I-I' and II-II' of FIGS. 1 and 2A, respectively.

Referring to FIGS. 1, 2A and 2B, a donor substrate 200 is disposed on the device substrate 100.

The device substrate 100 includes a pixel region P having a unit pixel array having columns Pc and rows, and an alignment mark region AM having a plurality of alignment mark pairs 133. The unit pixel array includes unit pixels arranged in a stripe shape. That is, each column Pc of the unit pixel array may include unit pixels having the same color. However, the unit pixels may be arranged in a delta or mosaic shape, as well as a stripe shape.

The device substrate 100 includes a device base substrate 101. The device base substrate 101 maybe formed of glass, plastic, quartz, silicon or metal. Furthermore, the device base substrate 101 may be a flexible substrate. A semiconductor layer 110 is disposed on the pixel region P of the device base substrate 101. The semiconductor layer 110 may be an amorphous silicon layer or a polysilicon layer, the amorphous silicon layer being crystallized. A gate insulating layer 115 is disposed on the entire surface of the substrate 101, including the semiconductor layer 110. A gate electrode 120 is disposed on the gate insulating layer 115 so as to overlap the semiconductor layer 110. A first interlayer insulating layer 125 is disposed on the entire surface of the substrate 101, including the gate electrode 120, so as to cover the semiconductor layer 110 and the gate electrode 120. Source and drain electrodes 130a and 130b, respectively, are disposed on the first interlayer insulating layer 125 so as to pass through the first interlayer insulating layer 125 and the gate insulating layer 115 and so as to be connected to respective ends of the semiconductor layer 110. The semiconductor layer 110, the gate electrode 120, and the source and drain electrodes 130a and 130b, respectively, compose a thin film transistor (TFT). Meanwhile, alignment marks 133 are located on the first interlayer insulating layer 125 of the alignment mark region AM. For the sake of convenience in the process, the alignment marks 133 may be formed together when forming the source and drain electrodes 130a and 130b, respectively. Furthermore, the alignment marks 133 maybe formed of an aluminum layer, a molybdenum layer, an aluminum alloy layer, or a molybdenum alloy layer. However, the alignment marks 133 are not limited thereto, and may be formed of any material layer having good reflective characteristics.

A buffer layer 105 is provided that serves to prevent impurities, such as moisture or gas, generated in the substrate from diffusing or penetrating into upper layers.

A second interlayer insulating layer 137 is disposed on the entire surface of the substrate 101, including the source and drain electrodes 130a and 130b, respectively, and the alignment marks 133 so as to cover the source and drain electrodes 130a and 130b, respectively, and the alignment marks 133. The second interlayer insulating layer 137 may include a passivation layer for protecting the TFT, and/or a planarization layer for smoothing a step due to formation of the TFT. A pixel electrode 150 is disposed on the second interlayer insulating layer 137 so as to pass through the second interlayer insulating layer 137, and so as to be connected to the drain electrode 130b. The pixel electrode 150 maybe, for example, an indium tin oxide (ITO) layer or an indium zinc oxide (IZO) layer. A pixel defining layer 155, having an opening 155a for exposing a portion of the pixel electrode 150, may be disposed on the pixel electrode 150.

The donor substrate 200 includes a donor base substrate 201, and a light-to-heat conversion layer 210 and a transfer layer 220 which are sequentially deposited on one surface of the donor base substrate 201. The donor base substrate 201 may be formed of a transparent polymer organic material, such as polyethyleneterephthalate (PET) or the like. The light-to-heat conversion layer 210 for converting incident light to heat may include a light absorbent material such as aluminum oxide, aluminum sulfide, carbon black, graphite and/or infrared dye. The transfer layer 220 may be an organic transfer layer when the device substrate 100 is an OLED substrate. The organic transfer layer 220 may be at least one layer selected from the group consisting of a hole-injecting organic layer, a hole-transporting organic layer, an electroluminescent organic layer, a hole blocking organic layer, an electron-transporting organic layer, and an electron-injecting organic layer.

Figure 3A:
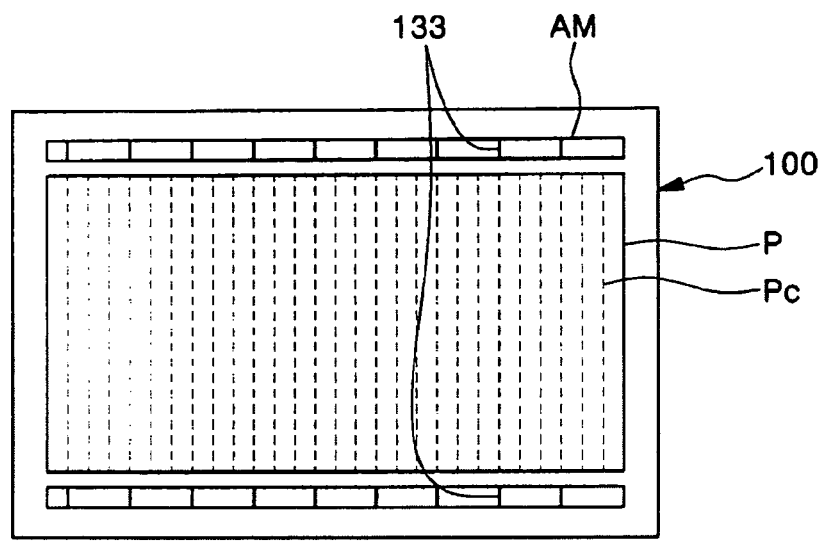
FIGS. 3A and 3B are plan views of device substrates of flat panel displays in accordance with another embodiment of the present invention.
Figure 3B:
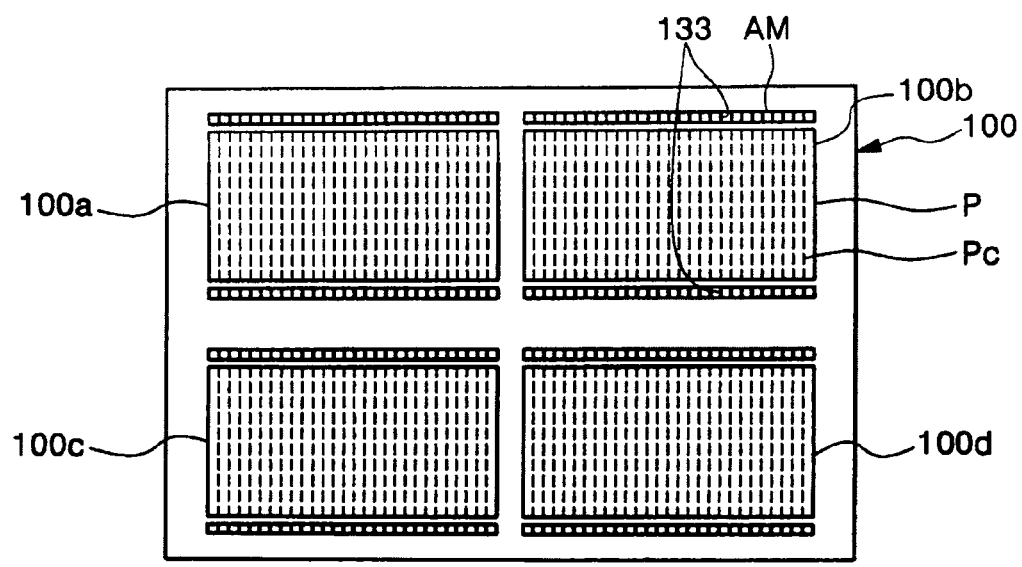

FIGS. 3A and 3B are plan views of substrates of flat panel displays in accordance with another embodiment of the present invention. The device substrates of the flat panel displays in accordance with this embodiment of the present invention are similar to the device substrate of the flat panel display described with reference to FIG. 1, except for the following description.

Referring to FIG. 3A, each of the alignment mark regions AM includes at least one alignment mark pair 133 disposed opposite to each other, and the alignment mark pairs 133 are located in correspondence with a plurality of columns Pc of a unit pixel array. The interval between the alignment mark pairs 133 is n times larger than that between the columns Pc of the unit pixel array (n is an integer).

Referring to FIG. 3B, the device substrate 100 includes a plurality of device cells 100a thru 100d. Each of the device cells 100a thru 100d includes a pixel region P and alignment mark regions AM. As shown, the alignment mark regions AM include alignment mark pairs 133 corresponding to columns Pc of the unit pixel array, respectively. On the other hand, each of the alignment mark pairs 133 of the device substrate 100 shown in FIG. 3A is disposed in correspondence with a plurality of columns Pc of the unit pixel array, and the interval between the alignment mark pairs 133 may be n times larger than that between the columns Pc of the unit pixel array (n is an integer). Furthermore, the device substrate 100 of FIG. 3B may have a size larger than that of the device substrate of FIGS. 1 and 3A.

FIGS. 4A thru 4D are plan views of the laser induced thermal imaging apparatus shown in FIG. 1, illustrating a method of fabricating a flat panel display in accordance with an embodiment of the present invention, and specifically forming a pattern on a device substrate.

Figure 4A:
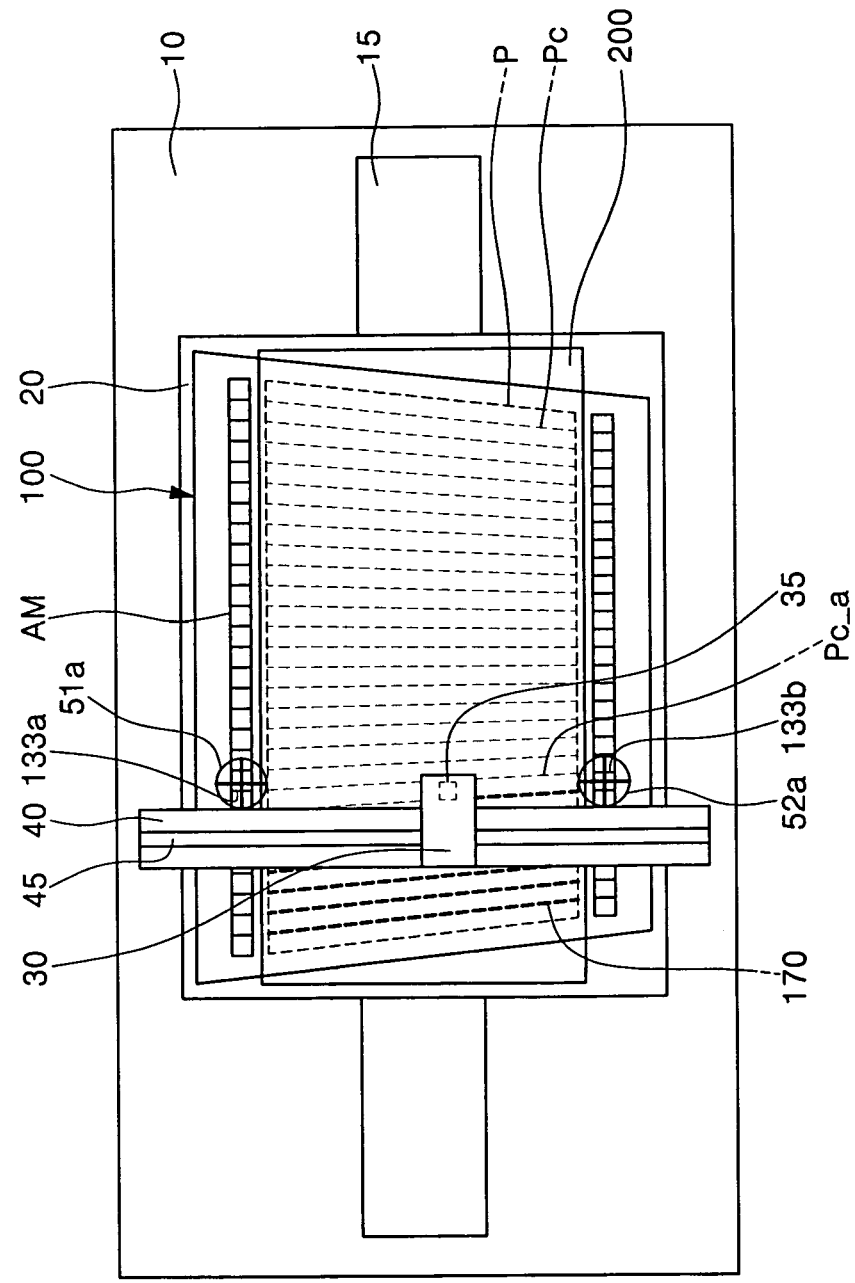

Referring to FIG. 4A, a device substrate 100 is located on a chuck 20. The device substrate 100 may be the device substrate described with reference to FIGS. 1, 2A and 2B, or the device substrate described with reference to FIGS. 3A and 3B. The device substrate 100 may be deformed during the processes for forming various patterns. While the device substrate 100 shown has an upper part larger than a lower part, it is not limited thereto, and may be modified in various ways. Furthermore, the device substrate 100 may be largely deformed when it is a flexible substrate or a large-sized substrate.

A donor substrate 200 is located on the device substrate 100. The donor substrate 200 may be the donor substrate described with reference to FIGS. 1 and 2B. The donor substrate 200 is located so as to cover at least the pixel region P of the device substrate 100, a transfer layer 220 (see FIG. 2) being disposed opposite to the device substrate 100.

Positions of the alignment mark pairs 133a and 133b are then measured using cameras 51 and 52 (see FIG. 1). Specifically, a degree of deviation of the alignment marks 133a and 133b, as photographed by the cameras 51 and 52, relative to a center part of images 51a and 52a, as photographed by the cameras 51 and 52, is measured. As a result, position factors of a column Pc_a of the unit pixel array corresponding to the alignment mark pairs 133a and 133b, and specifically, its start point, a finish point, and a straight path between the start point and the finish point, are calculated.

Figure 4B:
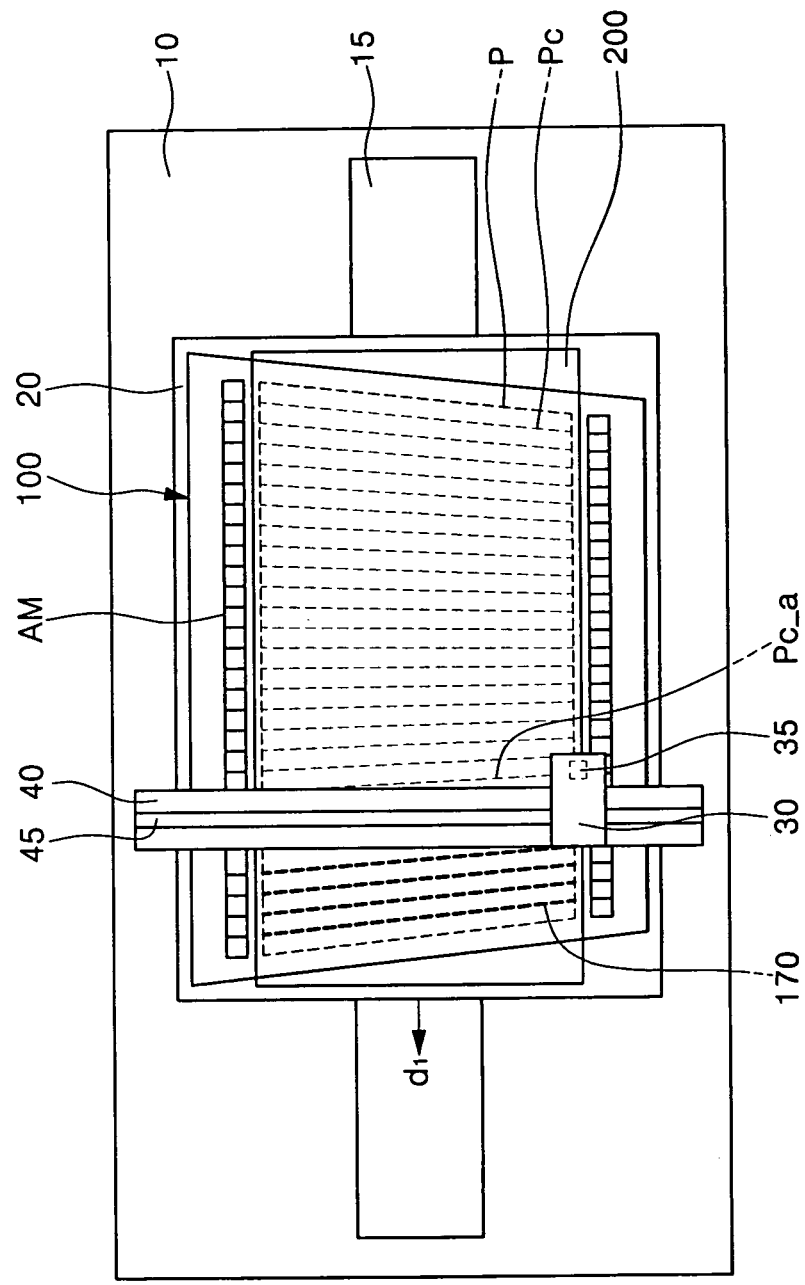

Referring to FIG. 4B, an optical stage 40 is fixed, a chuck 20 is moved along a chuck guide bar 15 in a first direction d1, and a laser irradiation apparatus 30 moves a predetermined distance along a laser guide bar 45. Therefore, the laser irradiation apparatus 30, and specifically a laser beam irradiating region 35 irradiated by the laser irradiation apparatus 30, may be located on the start point of the column Pc_a of the unit pixel array.

Figure 4D:
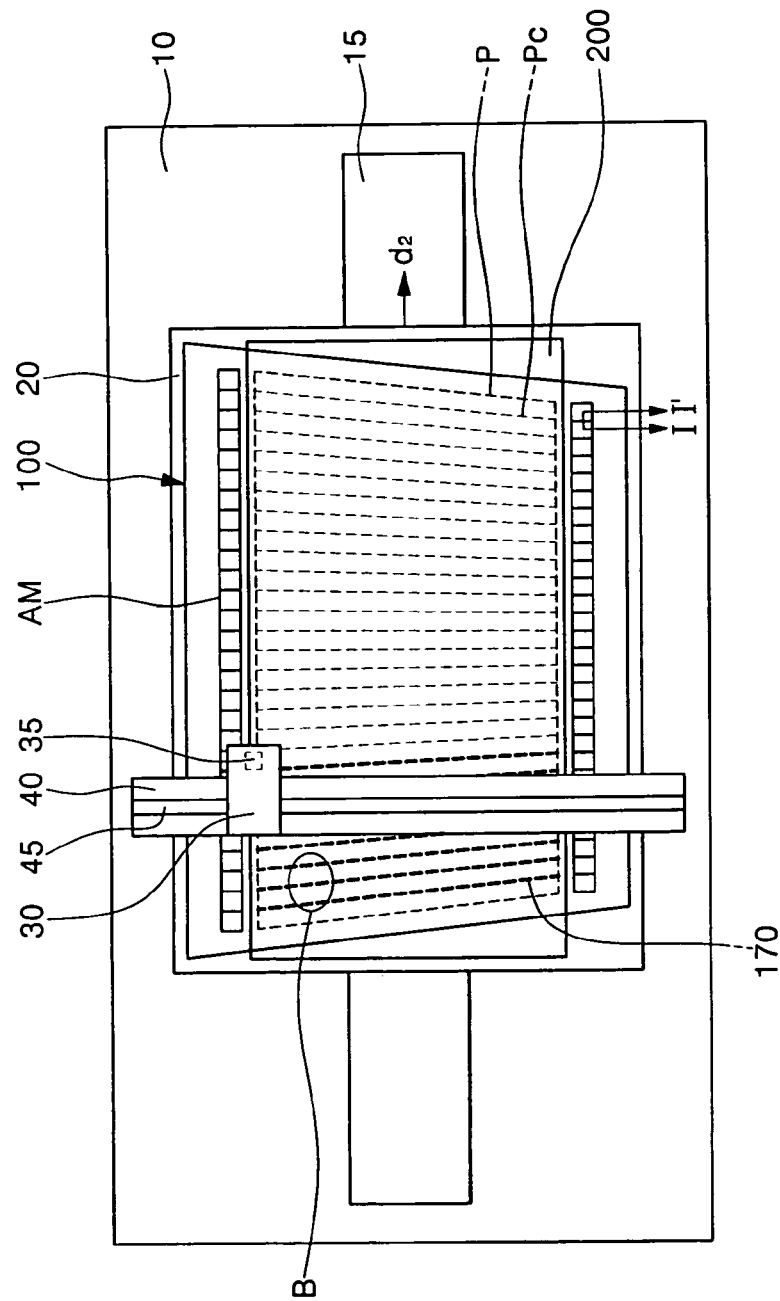
Figure 5:
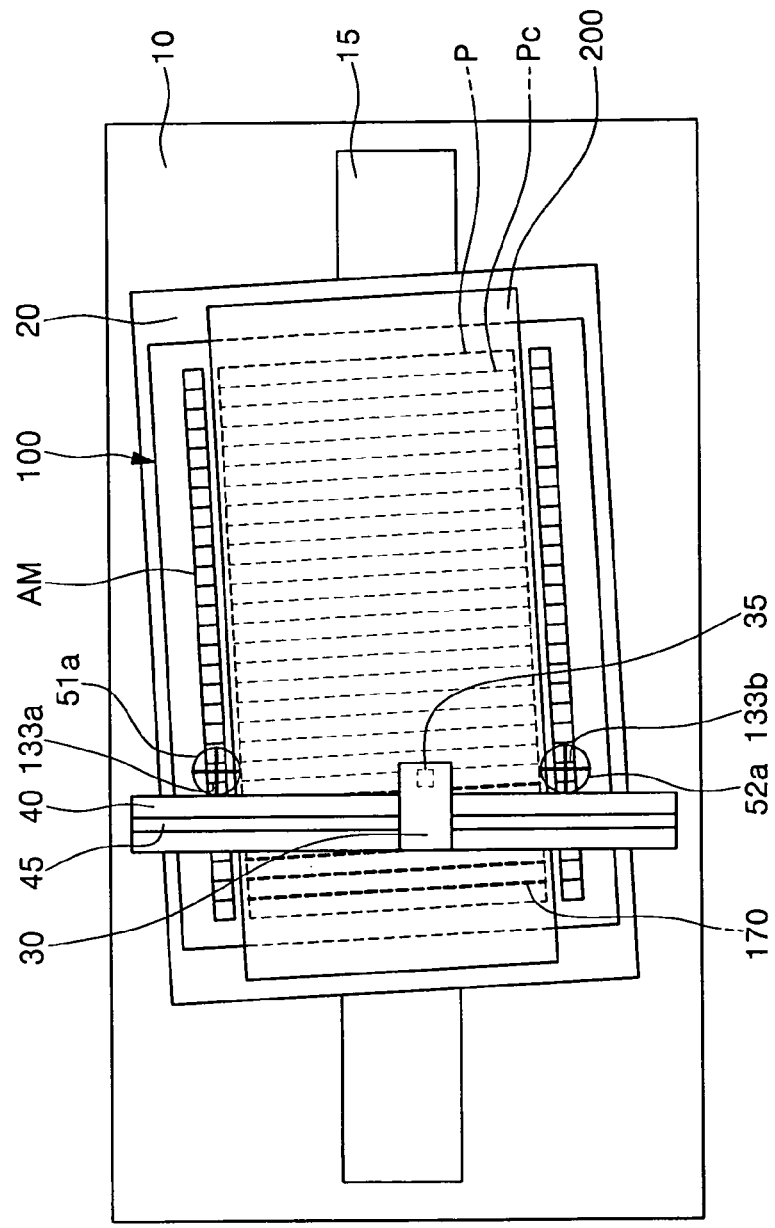
FIG. 5 is a plan view illustrating a method of fabricating a flat panel display in accordance with another embodiment of the present invention.

Referring to FIGS. 4C and 4D, the laser irradiation apparatus 30 irradiates a laser beam along the calculated position of the column Pc_a of the unit pixel array. Irradiating the laser beam along the calculated position may be performed by moving the laser irradiation apparatus 30 along the laser guide bar 45, moving the chuck 20 along the chuck guide bar 15 in a second direction d2 together with movement of the laser irradiation apparatus 30, and simultaneously irradiating the laser beam onto the substrate, specifically, the donor substrate 200.

The laser beam irradiated onto the donor substrate 200 is absorbed by a light-to-heat conversion layer 210 (see FIG. 2B). In the region of the donor substrate 200 onto which the laser beam is irradiated, the light-to-heat conversion layer 210 absorbs the laser beam so as to generate heat, and adhesion of the transfer layer 220 (see FIG. 2B) under the light-to-heat conversion layer 210 varies depending on the heat to be transferred on the device substrate 100. As a result, a transfer layer pattern 170 is formed on the device substrate 100, specifically, on the column Pc_a of the unit pixel array.

Next, the chuck 20 is moved by one step, and a transfer layer pattern is formed on another column of the unit pixel array by means of the abovementioned processes.

As described above, the transfer layer pattern is formed on an accurate position by positioning alignment mark pairs located in correspondence with the column of the unit pixel array at opposite sides of the pixel region, by measuring the position of the alignment mark pairs, by calculating the position of the column of the unit pixel array corresponding to the alignment mark pairs using the measured result, and by irradiating the laser beam along the calculated position, even when the substrate is deformed.

On the other hand, when the device substrate 100 is not deformed, for example, even when a straightness error is generated while the chuck fixing the device substrate 100 is moved, the transfer layer pattern can be formed at an accurate position by means of the abovementioned processes.

Figure 6:
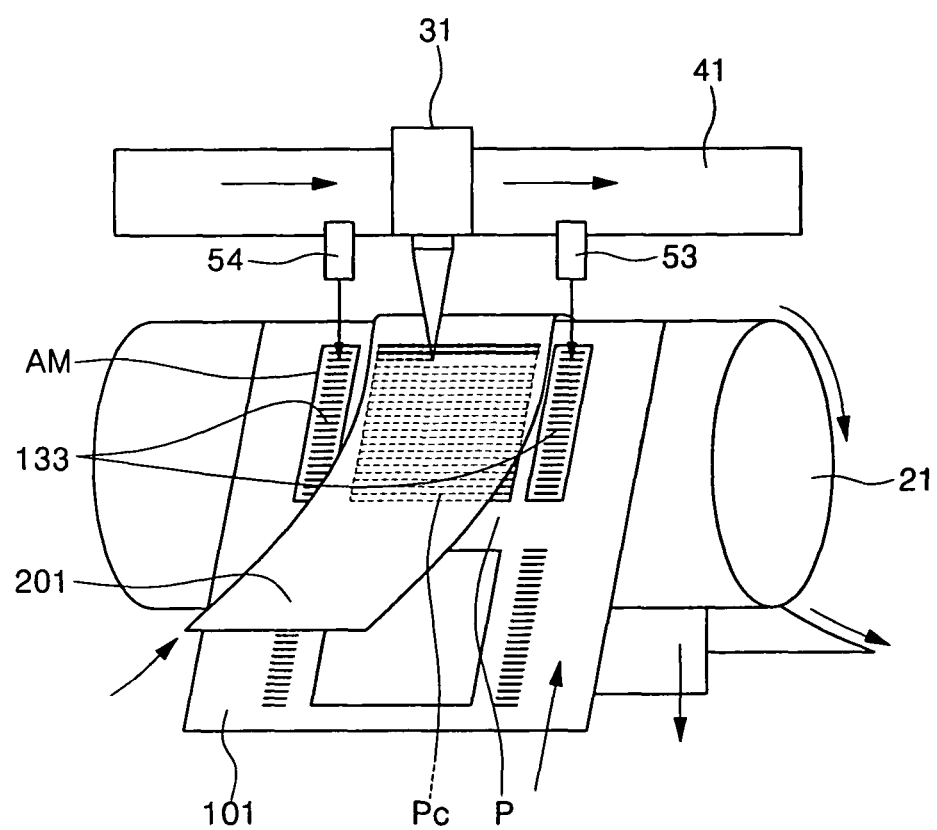
FIG. 6 is a schematic view of a laser induced thermal imaging apparatus for forming a pattern on a device substrate in accordance with another embodiment of the present invention.

FIG. 6 is a schematic view of a laser induced thermal imaging apparatus for forming a pattern on a device substrate in accordance with another embodiment of the present invention.

Referring to FIG. 6, the laser induced heat imaging apparatus includes a chuck 21. A device substrate 101 is fixed on the chuck 21. The device substrate 101 is a flexible substrate. The device substrate 101 may be a plastic substrate or a metal foil substrate. The device substrate 101 is similar to the device substrate of FIGS. 1, 2A and 2B, except that the device substrate 101 is a flexible substrate. Therefore, the device substrate 101 also includes a pixel region P and alignment mark regions AM. The alignment mark regions AM are located at opposite sides of the pixel region P and along the pixel region P. The pixel region P includes a unit pixel array having columns Pc and rows. Each of the alignment mark regions AM includes at least one pair of alignment marks 133 disposed opposite to each other. The alignment mark pairs 133 are located in correspondence with the column Pc of the unit pixel array.

A donor substrate 201 may be disposed on the device substrate 101 so as to cover at least the pixel region P. The donor substrate 201 is also similar to the donor substrate of FIGS. 1 and 2B. The device substrate 101 and the donor substrate 201 maybe supplied in a rotational direction of the chuck 21 so as to be laminated on the chuck 21.

An optical stage 41 is located on the chuck 21. A laser irradiation apparatus 31 is installed on the optical stage 41. The optical stage 41 may include a laser guide bar (not shown) for moving the laser irradiation apparatus 31 in a Y-axis direction.

Cameras 53 and 54 are installed on respective side portions of the optical stage 41. The cameras 53 and 54 may be located at arbitrary positions, regardless of the number of cameras, so as to photograph the alignment mark pairs arranged in the alignment mark regions AM.

A transfer layer pattern can be formed on the device substrate using the apparatus and by means of the same processes described with reference to FIGS. 4A thru 4D. Therefore, the transfer layer pattern can be formed on an accurate position, even when the device substrate is a flexible substrate which is easily deformed.

Figure 7A:
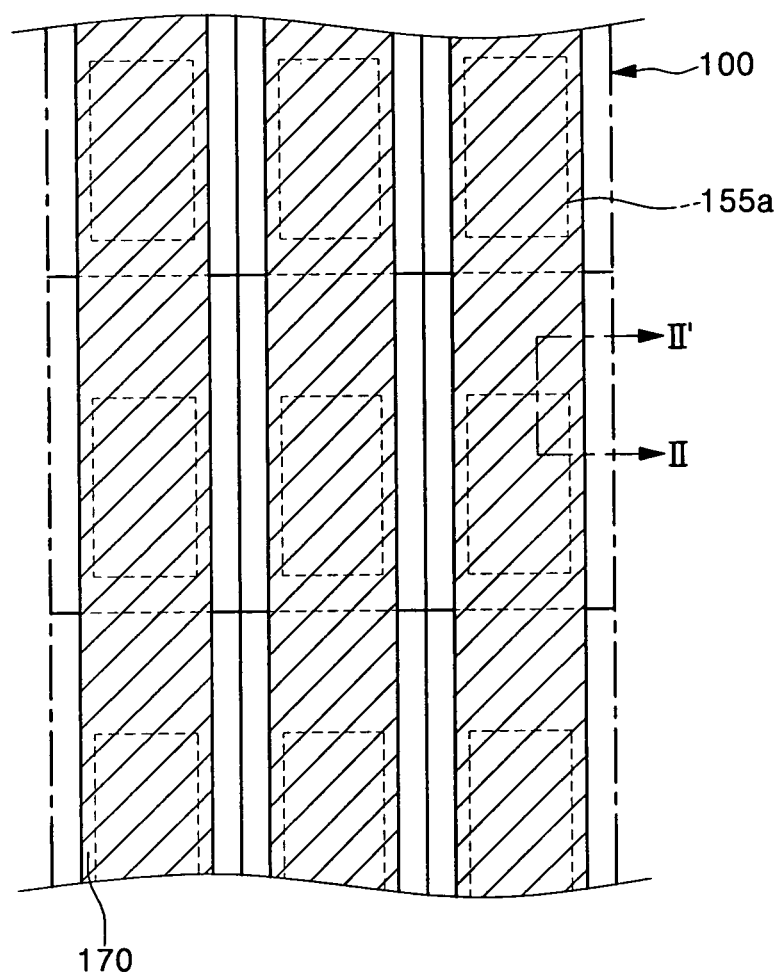
FIG. 7A is an enlarged plan view of a device substrate in region B of FIG. 4D.
Figure 7B:
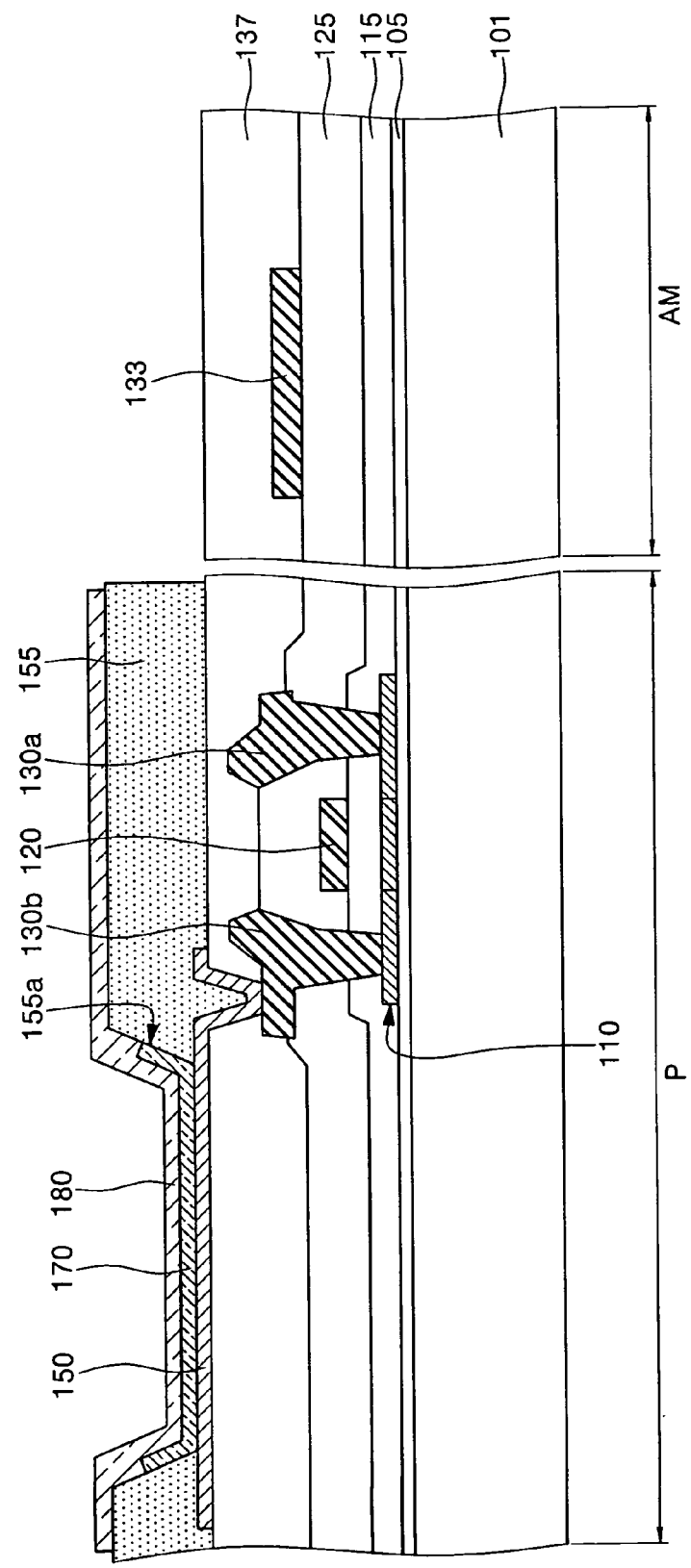
FIG. 7B is a cross-section view taken along sectional lines I-I' and II-II' of FIGS. 4D and 7A, respectively.

FIG. 7A is an enlarged plan view of a device substrate of region B of FIG. 4D, and FIG. 7B is a cross-section view taken along sectional lines I-I' and II-II' of FIGS. 4D and 7A, respectively.

Referring to FIGS. 7A and 7B, a transfer layer pattern 170 is located on an exposed pixel electrode 150 in an opening 155a of the device substrate 100 described with reference to FIGS. 2A and 2B. The transfer layer pattern 170 may be an emission layer. Furthermore, the transfer layer pattern 170 may include at least one layer selected from the group consisting of a hole-injecting layer, a hole-transporting layer, a hole blocking layer, an electron-transporting layer, and an electron-injecting layer.

An opposite electrode 180 is then formed on the transfer layer pattern 170 so as to complete the organic light emitting display (OLED).

As can be seen from the foregoing, although the substrate is deformed or inaccurately conveyed, the transfer layer pattern can be formed at an accurate position.

Although the present invention has been described with reference to certain exemplary embodiments thereof, it will be understood by those skilled in the art that a variety of modifications and variations may be made to the present invention without departing from the spirit or scope of the present invention, as defined in the appended claims, and their equivalents.

What is claimed is:

1. A flat panel display device, comprising:
   an acceptor substrate on which organic emission layers are formed by laser induced thermal imaging, bearing a pixel region bordered along each of opposite sides of the pixel region by a row of an alignment mark region;
   a plurality of alignment marks disposed uniformly spaced apart in series of said alignment marks to provide a plurality of pairs of alignment marks located opposite to each other on each alignment mark region of each substrate;
   a plurality of columns of an array of unit pixel which includes a pixel electrode, an opposite electrode, and one of the organic emission layers interposed between the pixel electrode and the opposite electrode, formed in a matrix upon the pixel region in linear alignment with corresponding pairs of said alignment marks and rows of unit pixel arrays are disposed in conformance to said series of said alignment marks.

2. The flat panel display device according to claim 1, further comprised of:
   a plurality of position factors determined for each said pair of the alignment marks in dependence upon measured positions of each said pair of alignment marks; and
   the columns of the unit pixel array formed in said linear alignment with the position factors for the corresponding pair of alignment marks located on the alignment mark regions.

3. The flat panel display device according to claim 2, each of said at least one pair of alignment marks is located on a line extending along a column of the unit pixel array.

4. The flat panel display device according to claim 1, each said pair of alignment marks is located on a respective alignment mark region so as to correspond to a plurality of columns of the unit pixel array, and an interval between said at least one pair of alignment marks is n times larger than an interval between the columns of the unit pixel array, n is an integer.

5. The flat panel display according to claim 1, each column of the unit pixel array has a same color unit pixel.

6. The flat panel display device according to claim 1, said plurality of position factors include a start point, a finish point and a straight path between said start point and said finish point of said column of the unit pixel array.

7. The flat panel display device according to claim 1, the pixel region has a thin film transistor including source and drain electrodes and the alignment marks are formed on the same layer as the source and drain electrodes.

8. A flat panel display device, comprising:
   an acceptor substrate on which organic emission layers are formed by laser induced thermal imaging, having a pixel region and alignment mark regions disposed at opposite sides of the pixel region and along the pixel region;
   a unit pixel array of having a plurality of rows and columns of pixel arranged on the pixel region, each pixel includes a pixel electrode, an opposite electrode, and one of the organic emission layers interposed between the pixel electrode and the opposite electrode;
   a plurality of transistors in the pixel region including a semiconductor layer and a gate electrode; and
   a plurality of reflective metal alignment marks arranged in pairs and disposed opposite to each other on the alignment mark regions, each of said pair of alignment marks of said plurality of alignment marks located on a line extending from each column of said plurality of columns of the unit pixel array;
   a plurality of position factors of said column of said plurality of columns of the unit pixel array is determined based on a measured position of said pair of alignment marks;
   each and every column of said plurality of columns of pixels has a corresponding pair of alignment marks.

* * * * *